United States Patent

Klein et al.

[15] 3,696,399

[45] Oct. 3, 1972

[54] RANGE EXPANSION METHOD AND APPARATUS FOR MULTICHANNEL PULSE ANALYSIS

[72] Inventors: Robert T. Klein, Hialeah; Robert L. Kreiselman, Miami, both of Fla.

[73] Assignee: Coulter Electronics, Inc., Hialeah, Fla.

[22] Filed: Sept. 11, 1970

[21] Appl. No.: 71,441

[52] U.S. Cl. ....................340/347 AD

[51] Int. Cl. ....................H03k 13/02

[58] Field of Search ..340/347 AD, 177; 179/15 AW, 179/15 AV

[56] References Cited

UNITED STATES PATENTS

| | | | |
|---|---|---|---|
| 3,491,295 | 1/1970 | Van Saun | 340/347 AD |
| 3,475,748 | 10/1969 | Price | 340/347 AD |
| 3,348,216 | 10/1967 | Vinson | 340/347 SH |
| 3,359,410 | 12/1967 | Frisby | 340/347 AD |
| 3,292,150 | 12/1966 | Wood | 340/347 AD |
| 3,500,247 | 3/1970 | Sekimoto | 340/347 SH |
| 3,421,083 | 1/1969 | Bosworth | 340/347 AD |

*Primary Examiner*—Thomas A. Robinson
*Assistant Examiner*—Jeremiah Glassman
*Attorney*—Silverman & Cass

[57] ABSTRACT

By expanding the input to an A to D converter, and also establishing an offset or low end threshold for pulse data as it is being processed by the A to D converter to a multichannel pulse amplitude memory, the fixed number of memory channels are effectively expanded and a selectively small portion of the channel range can be examined in increased detail. This method and apparatus differs from the prior art range expanding in that it operates upon pulse data during its collection and not after receipt in the memory; thus, a plurality of memory channels can act as a single and wider channel.

35 Claims, 3 Drawing Figures

PATENTED OCT 3 1972 3,696,399

Inventors
ROBERT I. KLEIN
ROBERT L. KREISELMAN
BY Silverman & Cass
ATTYS.

RANGE EXPANSION METHOD AND APPARATUS FOR MULTICHANNEL PULSE ANALYSIS

BACKGROUND OF THE INVENTION

Multichannel pulse analyzers are in increasing use in almost all fields where comparative, high speed, data collection and analysis can be useful. Theoretically, the more channels the data can be separated into, the greater the accuracy or resolution which can be obtained. Practically, cost, size, complexity, maintainence, etc. all increase as the number of channels increase; hence, a compromise often must be made. Often, the compromise results in the purchase of an analyzer having too few channels.

Once a multichannel analyzer is built, it is not easily converted to increase the number of channels; however, devices have been designed to increase the usefulness of a fixed channel system. Such devices are often called range expanders, since they take the data in a selected one or ones of the channels and spread or expand this data by amplifying means, to give the effect that the data was collected in numerous adjacent channels. For example, if an analyzer contained 100 channels and it is desired to examine in detail the data in the 10 channels numbered 50 to 60, the stored data in those memory channels could be amplified and the selected ten channels thereby spread or expanded by the selected amplification factor.

One drawback to the above described "store then expand" operation is that it makes inefficient use of the memory, since many channels could be storing unwanted information.

SUMMARY OF THE INVENTION

The invention provides method and apparatus for an "expand then store" multichannel operation, whereby data gathering has increased the efficient use of the limited number of data channels. As data is being collected, the desired range of channels is selected by offset means and a corresponding width amplifying function or expansion factor is applied to each pulse. Thereupon A to D conversion and memory storage concerns only the range of desired data, which has been expanded to fill the entire multichannel memory.

One particular use for this invention is in the field of particle analysis, in which the source of data pulses are generated by a particle analyzer, such as a "Coulter Counter."

DESCRIPTION OF THE PREFERRED EMBODIMENT

Figures 1, 2, 3:
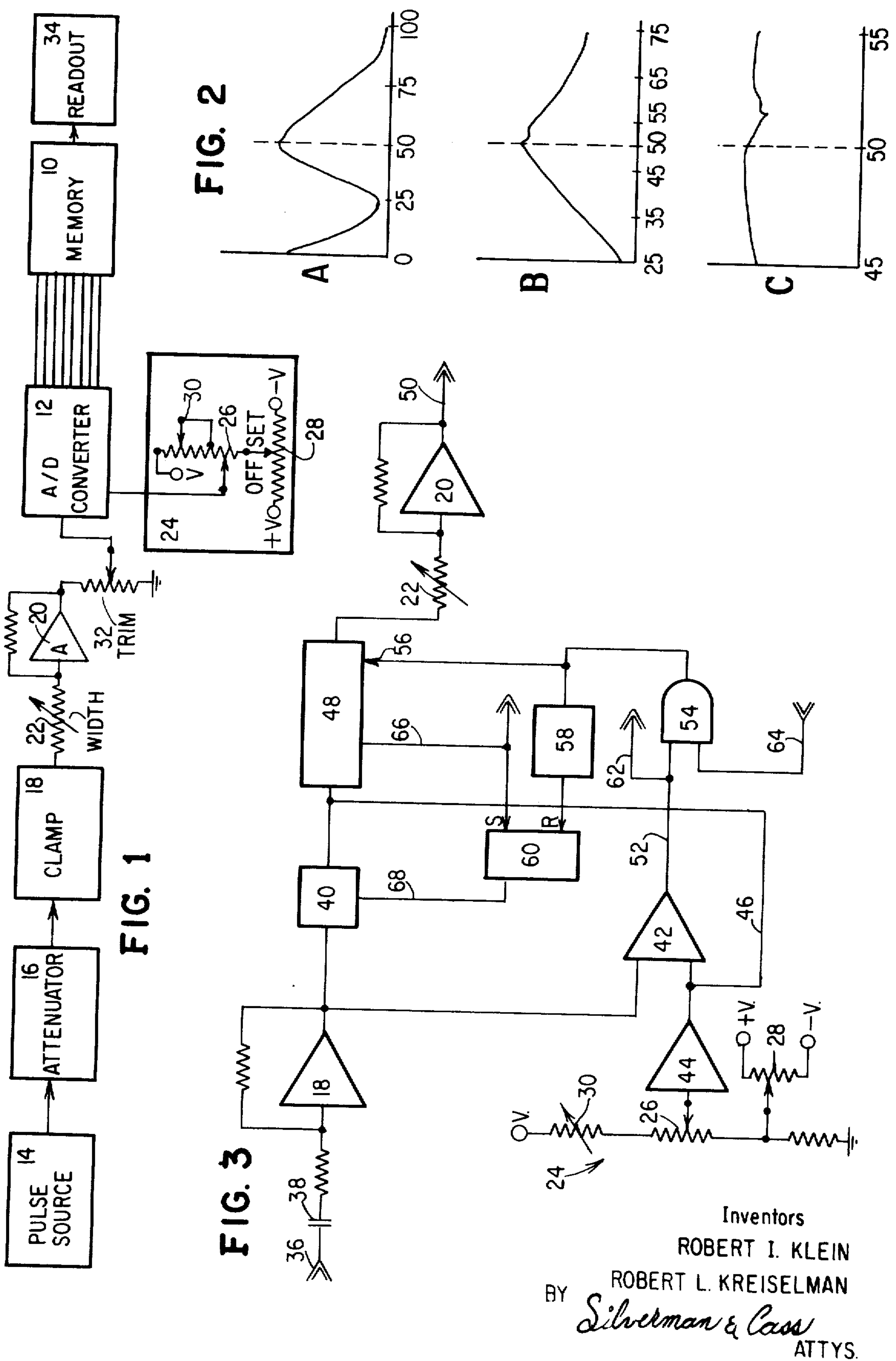
FIG. 1 is a schematic illustrating the broad concepts of the invention.
FIG. 2 shows three graphs A, B and C of collected data, in which graphs B and C are progressive range expansions of graph A.
FIG. 3 shows a more detailed schematic of the invention.

Looking first at FIG. 1, there is shown an "expand then store" arrangement for a typical multichannel memory unit 10. For purposes of discussion, it will be assumed that the memory 10 possesses 100 channels and receives data in digital form from an A to D converter 12. The precise type of memory 10 and converter 12 is unimportant for a full understanding of the invention, and the prior art provides adequate background in their use and content.

A pulse source 14 provides a train of pulses, the amplitudes of which carry the data which is to be converted and stored for analysis. In a preferred embodiment, the data could relate to the size distribution of a particulate system, in which the amplitude of each pulse of the train represents the size of a particle. One example of a particle analyzing pulse source 14 of this type is a "Coulter Counter."

To enable the subject range expansion method and apparatus to operate independent of the exact type of the pulse source 14, an attenuator 16 is provided. The attenuator is "fixed" in that once it is set, it treats all input pulses with the same amplification or attenuation factor. However, the fixed factor can be adjusted whenever the pulse source 14 is changed so that the range expansion can be normalized. For example, a "Coulter Counter" Model A particle analyzer would require a different attenuation factor from a "Coulter Counter" Model B type of particle analyzer.

The output from the attenuator 16 is connected to a clamp 18, which has the purpose of restoring a true ground reference or base level. At this point the data signals are ready for the expansion process.

The determination of how much expansion and which channels of data are to be retained and expanded is typically an operator controlled function. The source of pulses and the nature of the data being collected often establish prerequisites which aid the human operator to preset the range expansion parameters. Thereafter, an examination of the data, as it is being collected, may indicate the channel range requiring expansion. In some circumstances, the channel range of most interest might not be known until after the data has been collected. In the latter case, a recycle of the data collection process would be accomplished after the expansion parameters were set.

FIG. 2A shows a chart of a typical distribution of particle size in a particulate system. Each of the 100 channels represents a particle size, with the size increasing channel by channel, and the number of particles in each size channel being designated cumulatively by the Y axis position or height at the channel position.

Assuming that the pulse source 14 is a "Coulter Counter" analyzer, for example, the data in lower channels would be recognized as being greatly influenced by electronic noise, to the extent that it is merely a measure of noise pulses and not particle size. For that reason, channels one through 24 could be excluded from consideration. Because of coincidence of particles in the scanning ambit of a "Coulter Counter" analyzer and random very large particles of little interest, the data in channels above 75 is usually considered insignificant. Hence, of the original 100 channels, only 50 of them—those between 25 and 75—would be expected to carry data of interest.

Let it be assumed, for ease of discussion, that each of the 100 channels is to store data originating from pulse amplitudes in 1 volt increments, i.e., channel one stores the number of pulses having amplitudes lying between 0 and 1 volt; channel 50 "responds" to pulses having amplitudes lying between 49 and 50 volts; and channel 100 correlates to particle pulses in the 99 to 100 volt size. Stated differently, the A to D converter 12 has a full scale capability of 100 volts. Accordingly, use of only channels 25 to 75 is use of only one-half of the voltage capability or range of the system, more particularly the input range of the A to D converter 12 and thus the memory 10. Thus, an expansion factor of 2, the reciprocal of one-half, is available to maximize the use of the system. In like manner, if only 25 channels, such as channels 50 to 75, were of interest, an expansion factor of 4 would be available, so as to spread the width of the 25 channels of data over the entire one hundred channels receivable by the A to D converter 12 and retainable in the memory 10.

To accomplish the just discussed expansion by a determined expansion factor, an amplifier 20, having an operator-settable width control 22 is provided at the output of the clamp 18. A simple potentiometer would be sufficient for setting the width of the channel range employed to be equal to the full scale range of the system. The dial (not shown), by which the operator sets the width control 22, could be marked to show the fractional values of the channels being employed, compared to full scale, i.e., one-half and one-fourth in the above two examples, or their reciprocal, expansion factors 2 and 4, or the total number of channels being employed, 50 and 25. The latter would seem to be the most convenient for the operator.

Electrically speaking, the setting of the width control 22 of the amplifier 20 causes the pulses from the clamp 18 to be amplified by the above defined expansion factor, and the thus amplified pulses then are applied to the input of the A to D converter 12. As shown, the amplifier 20 can be of the operational type, having resistive feedback to determine its gain.

Continuing with the above setforth example, employing channels 25 to 75, the resulting expansion factor of 2, a full scale of 100 volts, 1 volt for each channel, the output from the amplifier 20 for pulses destined for channel 25 would be 50 volts and for channel 75 would be 150 volts. The latter is in excess of full scale and must be corrected. Such correction is provided by a system offset control 24, which is coupled to the A to D converter, and operates to subtract, from the instantaneous voltage of the signal pulses from the amplifier 20, a value sufficient to cause the expansion-factor amplified signal pulse for the lowest channel, in this example 50 volts and channel 25, to equal zero volts and thus fall into the lowest channel of the memory 10. Hence, the system offset control 24 would subtract 50 volts from all signals being fed to the converter 12, and thereby cause the 150 volt signals originally designated for channel 75 to become 100 volt signals for receipt by channel one hundred; hence, full scale utilization of the system.

As shown, the zero offset control includes a potentiometer 26 having as one terminal end the slider of another potentiometer 28, the latter being coupled between +V and −V. The other terminal of the potentiometer 26 is coupled to a source of reference voltage V, and its slider is connected to the A to D converter 12. A slider 30 is tapped to the potentiometer 26 for preset control purposes next discussed.

The potentiometers 28 and 30 are preset controls, with the setting of the slider of the potentiometer 28 employed to set the zero channel to match with a system zero setting, and the potentiometer 30 is to set the upper scale end of the system; hence these two controls are for tracking purposes and, once set for the system, should need little if any changing, and are not a dynamic part of the range expansion circuitry. If the pulse source 14 was a "Coulter Counter" analyzer having threshold controls, it would be set to zero threshold and then the potentiometer 28 adjusted to provide a zeroed response. Likewise, the slider 30 would be set so that known size pulses in the high range, such as for channel 90, are collected in the proper channel; i.e., 90.

A further preset control is provided by a potentiometer 32, which is interposed between the amplifier 20 and the A to D converter 12, and provides a full scale trim adjustment. Properly set by the trim control 32, the full scale output from the amplifier 20 should be slightly greater than the full scale range of the A to D converter 12; thus, all one hundred channels are certain of being utilized.

According to the above, if the system was set to produce the graph of FIG. 2A, the width control 22 would be set for 100 channels and thus be applying a unity or no expansion factor, and the offset control would be set at zero so as to provide no offset.

To obtain the graph of FIG. 2B, the width control 22 would be set to fifty channels and thereby apply an expansion factor of two to the A to D converter. While at the same time, the offset control 24 would be set so that channel 25 was the lowest channel of interest and thus 50 volts of offset is provided by way of the potentiometer 26 to the A to D converter 12. An examination of FIG. 2B will reveal an irregularity in the plotted graph between channels 50 and 55.

Assuming the operator desired to investigate such irregularity in greater detail, he could reset the width control 22 to examine only 10 channels, which applies a tenfold expansion factor, and then select the 10 channels he wanted to store and graph, for example the channels 45 to 55. The latter selection is by use of the offset control 24, which is set to produce a sufficient subtractive voltage to bring channel 45 down to be equivalent to the zero channel position. Since there has been applied an expansion factor of 10, pulses entering channel 45 would have an amplitude of 450 volts; hence, that value must be subtracted from the instantaneous pulse signals by the setting of the offset control 24. Thus set, pulses destined for channel 55 would be reduced from 550 to 100 volts (55×10=550; 550−450=100d), which is at the top end of the memory channel 100.

The thus expanded data is shown in graph 2C and reveals a seeming irregular distribution of data in channels 50 through 53. The significance of this irregularity is beyond the scope of this discussion, but in the field of hematology could be especially important.

Yet again, further range expansion could isolate channels 50 to 53 and even any one of them.

It will be appreciated by those skilled in the art that the above discussed voltages are only being selected for use of whole numbers. It is likely that full scale in a commercial embodiment would be closer to 10 volts and not 100 volts. Likewise, and not mentioned above, the memory output would be received by one or more recording devices, illustrated in FIG. 1 by a readout block 34.

Looking next at FIG. 3, there is shown a form of the range expansion apparatus which can operate in many commercial environments. Elements common to those in FIG. 1 carry the same reference numerals. For simplicity, FIG. 3 does not show the pulse source 14, the attenuator 16, the memory 10, the A to D converter 12, or the readout 34, but provides input and output to some of these elements.

Commencing at the upper left in FIG. 3, the output from the attenuator 16 is carried by a lead 36 to a d.c. filtering capacitor 38 and then to the clamp 18. The output from the clamp goes to a normally closed, disconnect switch 40 and also to one side of a comparator 42. The other side of the comparator is connected to the output from a buffer amplifier 44, which acts to linearize the offset adjustment potentiometer 26 to which it is coupled. The output from the buffer amplifier 44 also is coupled, by way of a lead 46, to a peak detector and hold circuit 48, which is a significant circuitry addition in FIG. 3. A majority of the other elements added in FIG. 3 beyond that of FIG. 1 are in support of the peak detector and hold circuit as well as provide control to and from the A to D converter. Such circuit 48 per se is well known, often is called a sample and hold or a pulse stretcher, and operates to provide output pulses shaped for easier and more reliable processing by subsequent stages, such as the A to D converter 12, to which an output lead 50 from the amplifier is coupled, by way of the width control 22 and the amplifier 20.

Whenever an input data pulse, as seen at the comparator 42 from the clamp 18, exceeds the offset voltage, as seen at the other input to the comparator from the buffer amplifier 44, that data pulse is of interest and causes an output signal from the comparator on a lead 52. That output signal is gated through an OR gate 54 and is applied to an enabling input 56 of the hold portion of the peak detector and hold circuit 48, and also is coupled to a trailing edge detector 58. The output from the trailing edge detector goes to the reset input R of a bistable device 60.

The comparator output on lead 52 also is coupled by a lead 62 to a reset input of the A to D converter. The latter connection arrangement is a safety feature, since the A to D converter 12 is internally constructed to be self-resetting after each data pulse. The converter also provides a hold control signal, which is applied to a lead 64 through the OR gate 54. In this manner, if the converter operates slower than the train of data pulses otherwise would dictate, the converter can force the sample and hold circuit 48 to hold the in process pulse until the converter has finished converting it.

Each time that any data pulse is received by the clamp 18, independent of whether or not that pulse is to be expanded, it normally will pass through the disconnect switch 40 and be received by the peak detecting portion of the circuit 48; however, in the absence of an output signal from the comparator, which signifies that the data pulse is large enough to be expanded and stored, there is no input from the lead 56 to the hold circuit portion of the circuit 48. As a consequence, the too small data pulse is not held or stretched. Moreover, there is not generated in the hold circuit portion of the circuit 48 an A to D start signal on a lead 66, which is coupled both to a start input of the A to D converter 12 as well as the set input S of the bistable device. Accordingly, the too small data pulses, although they pass through the peak detector and hold circuit 48, and are fed to the width control 22 and the amplifier 20, they are not stretched and are not received by the A to D converter.

Data pulses which are large enough to activate the comparator 42 do, by way of the OR 54 and the hold enabling input 56, trigger the hold circuit portion and, by way of the start lead 66, start the A to D converter and set the bistable device 60. As a result, these data pulses are stretched and received by the A to D converter. The setting of the bistable device 60 open-circuits the disconnect switch 40, by way of a coupling lead 68, to prevent the next following data pulse from being applied to the peak detector portion of the circuit 48 until after the reset operation, above discussed.

Yet to be mentioned are the data pulses which are too large, i.e., above the range expanded channels. Those data pulses logically and electronically are treated in the same manner as the data pulses of interest; however, expansion causes them to be converted into signals greater than full scale, hence, above channel 100. Consequently, such pulses are effectively excluded.

It now will be appreciated that exclusion of the too small and too large pulses in the manner above described is analogous to the operation of a threshold window. Setting of the bottom of the window is accomplished by the offset control 24; whereas, the top of the window is determined by the width control 22, which establishes the expansion factor.

It is believed that the subject "expand before store" expansion method and apparatus has been disclosed and illustrated adequately for those skilled in the art to understand and practice same and appreciate the scope of the invention as setforth in the claims appended hereto.

What is desired to secure by Letters Patent of the United States is:

1. An expand then store method of range expansion for multichannel data analysis, the data to be stored in a multichannel memory, comprising the steps of:
   determining electronically a total number of channels of interest which is to be employed for expansion, out of an originally available total number of channels,
   selecting electronically a specific range of channels of interest which is to be employed for expansion,
   applying electronically an expansion factor at least to the specific range of channels of interest, and
   executing each of the above steps prior to the storage of data in a multichannel data memory, whereby the data is range expanded prior to its storage.

2. A method according to claim 1 further comprising
   establishing electronically, by said determining, the expansion factor for said applying.

3. A method according to claim 2 wherein
   the mathematic product of the determined total number of channels of interest and the established expansion factor equals the total number of originally available channels.

4. A method according to claim 1 in which the data, prior to storage, is in the form of signal pulses of varying amplitude and
said applying of the expansion factor amplifies, proportional to the expansion factor, at least the signal pulses to be received in the specific range of channels of interest.

5. A method according to claim 4 in which
voltage offsetting defines the highest channel of the specific range and causes the expansion factor amplified signal pulses acceptable by the highest channel of the specific range to have the same maximum amplitude as that acceptable by the highest channel of the originally available channels.

6. A method according to claim 4 in which voltage offsetting defines the lowest channel of the specific range and causes the expansion factor amplified signal pulses acceptable by the lowest channel of the specific range to have the same minimum amplitude as that acceptable by the lowest channel of the originally available channels.

7. A method according to claim 6 further comprising
processing all signal pulses exceeding said minimum amplitude by peak detecting and stretching,
converting in an analog to digital mode to obtain digital data all such pulses on the basis of their expansion amplitudes, and
transferring the resulting digital data for multichannel data storage.

8. A method according to claim 1 in which
defining electronically the lowest channel of the specific range is the manner by which said range selecting is accomplished.

9. A method according to claim 8 in which
said defining is accomplished by creating a low end threshold.

10. A method according to claim 8 wherein
said defining is accomplished by voltage offsetting.

11. A method according to claim 10 wherein said voltage offsetting causes the lowest channel of the specific range to have its low end scaled to equal the low end of the lowest channel of the originally available channels.

12. A method according to claim 10 wherein said voltage offsetting causes the highest channel of the specific range to have its high end scaled to equal the high end of the highest channel of the originally available channels.

13. A method according to claim 1 in which
said executing is accomplished prior to the generation of the data which is to be stored.

14. A method according to claim 1 in which
said executing is accomplished during the generation of the data which is to be stored.

15. A method according to claim 1 in which
said executing is accomplished prior to and during the generation of the data which is to be stored.

16. A method according to claim 1 which further comprises
generating the data in the form of a train of pulses of varying amplitude, the pulse amplitudes defining the original channels of destination, and
amplifying the pulses by said applying of the expansion factor, whereby the pulses destined for the specific range of channels become amplified to encompass the full scale of the originally available channels.

17. A method according to claim 16 wherein
said generating is accomplished by an electronic particle analyzer.

18. An expand then store apparatus for range expansion and use in multichannel data analysis, the data to be carried by pulses of varying amplitude and to be stored in a multichannel memory having a total number of available channels, comprising:
means for determining, out of the available total number of channels, a total number of channels of interest for data expansion,
means for selecting, from the available total number of channels, a specific range of channels of interest for data expansion, and
means for applying an expansion factor to those data pulses which, because of their respective amplitudes, otherwise would be stored only in the unexpanded specific range of channels of interest,
each of the herein defined apparatus means being operatively coupled to one another so that, prior to the memory storage of data, the data is range expanded so as to be capable of being stored in the total number of available channels.

19. Apparatus according to claim 18 in which
said means for determing the number of channels of interest is constructed and arranged, with respect to said means for applying the expansion factor, to establish a mathematic value for the expansion factor.

20. Apparatus according to claim 19 in which said means for applying the expansion factor is an amplifier which is to receive the data pulses prior to the data storage, and
said means for determining the number of channels of interest is an amplification control coupled to said amplifier and scaled with reference to the total number of available channels.

21. Apparatus according to claim 20 in which
said amplifier and said amplification control are constructed and scaled such that the mathematic product of the selected number of channels of interest and the established expansion factor equals the total number of available channels.

22. Apparatus according to claim 20 in which
an A to D converter is provided and is coupled to be responsive said amplifier and to said means for selecting the specific range of channels of interest.

23. Apparatus according to claim 22 in which said specific range selecting means comprises
data pulse amplitude offsetting means for changing the instantaneous amplitude of each data pulse.

24. Apparatus according to claim 23 in which said amplitude offsetting means comprises
a voltage subtracting arrangement which, when set to a specific range of channels, subtracts from each data pulse a voltage equal to the mathematic product of the low end voltage level of the lowest channel of the selected range and the expansion factor.

25. Apparatus according to claim 23 in which said amplitude offsetting means comprises
a voltage subtracting arrangement which, when set to a specific range of channels, subtracts from each data pulse a voltage equal to the low end voltage of the lowest channel of the selected range.

26. Apparatus according to claim 25 in which control and comparison circuitry are provided and coupled to an input of said A to D converter and operate to enable said converter to receive only those data pulses having amplitudes greater than that subtracted by said voltage offsetting means.

27. Apparatus according to claim 26 in which peak detecting and hold circuitry are coupled to said A to D converter, so as to receive the data pulses prior to said converter and are coupled to be controlled by said control and comparison circuitry, whereby only data pulses exceeding the voltage subtracted by said voltage offsetting means are held.

28. Apparatus according to claim 18 in which said specific range selecting means comprises data pulse amplitude offsetting means for changing the instantaneous amplitude of each data pulse.

29. Apparatus according to claim 28 in which said amplitude offsetting means comprises a voltage subtracting arrangement which, when set to a specific range of channels, subtracts from each data pulse a voltage equal to the low end voltage of the lowest channel of the selected range.

30. Apparatus according to claim 29 in which an A to D converter is provided with one input coupled to receive data pulses to which has been applied the expansion factor.

31. Apparatus according to claim 30 in which control and comparison circuitry are provided and coupled to an input of said A to D converter and operate to enable said converter to receive only those data pulses having amplitudes greater than that subtracted by said voltage offsetting means.

32. Apparatus according to claim 31 in which peak detecting and hold circuitry are coupled to said A to D converter, so as to receive the data pulses prior to said converter and are coupled to be controlled by said control and comparison circuitry, whereby only data pulses exceeding the voltage subtracted by said voltage offsetting means are held.

33. Apparatus according to claim 18 in which both said channel number determining means and said range selecting means are potentiometer arrangements.

34. Apparatus according to claim 33 in which both said potentiometer arrangements are coupled to an A to D converter and said potentiometer arrangements operate with respect to the data pulses to establish a low threshold scaled to the lowest channel of the selected range and to establish the expansion factor such that the amplitude of data pulses for the highest channel of the selected range is substantially equal to full scale of said A to D converter.

35. Apparatus according to claim 34 in which a data pulse source is provided in the form of a particle analyzer.

* * * * *